United States Patent

Onishi

[11] Patent Number: 6,101,092
[45] Date of Patent: Aug. 8, 2000

[54] HEAT-DISSIPATING STRUCTURE OF AN ELECTRONIC PART

[75] Inventor: Yukihiro Onishi, Fukushima-ken, Japan

[73] Assignee: Alps Electric Co., Ltd., Tokyo, Japan

[21] Appl. No.: 08/995,677

[22] Filed: Dec. 22, 1997

[30] Foreign Application Priority Data

Dec. 27, 1996 [JP] Japan ................................. 8-358204

[51] Int. Cl.[7] .................................................. H05K 7/20
[52] U.S. Cl. .................... 361/705; 174/35 GC; 361/719; 361/818
[58] Field of Search ................................. 174/16.3, 35 R, 174/35 GC; 257/707, 714, 723, 704, 685, 686; 165/80.3, 185; 361/704, 705, 713, 752, 715–719, 753, 800, 816, 818

[56] References Cited

U.S. PATENT DOCUMENTS

| 4,621,304 | 11/1986 | Oogaki . |
|---|---|---|
| 5,099,396 | 3/1992 | Barz . |
| 5,227,663 | 7/1993 | Patil . |
| 5,468,910 | 11/1995 | Knapp . |
| 5,777,847 | 7/1998 | Tokuno . |
| 5,787,976 | 8/1998 | Warren . |

FOREIGN PATENT DOCUMENTS 59-166488  11/1994  Japan .

*Primary Examiner*—Gerald Tolin
*Attorney, Agent, or Firm*—Brinks Hofer Gilson & Lione

[57] ABSTRACT

A heat-dissipating structure in which a cylindrical projecting portion is formed in a shield case so as to project inwardly of the shield case and contact an electronic part encased in the shield case. This heat-dissipating structure has high heat conductivity and can reduce the amount of interfering signals being emitted from or rushing into the case.

2 Claims, 3 Drawing Sheets

HEAT-DISSIPATING STRUCTURE OF AN ELECTRONIC PART

BACKGROUND OF THE INVENTION

1. Field of the Invention

The present invention relates to a heat-dissipating structure of an electronic part mounted to a circuit board in a shield case.

2. Description of the Related Art

In an electronic device forming a high-frequency circuit, a circuit board with an electronic part mounted thereto is usually encased in a shield case. When the electronic part mounted onto the circuit board is one that generates heat, such as an integrated circuit (IC), part of the shield case is formed so as to contact the body of the electronic part that generates heat, allowing dissipation of heat by conduction through the shield case. A description will now be given of a conventional heat-dissipating structure of such a type, with reference to FIGS. 7 and 8. FIG. 7 is a sectional view of the main portion of the shield case, illustrating the conventional heat-dissipating structure. FIG. 8 is a plan view of the cover in the conventional heat-dissipating structure.

A circuit board 2 is encased in a shield case 1. An electronic part 3, such as an integrated circuit (IC), a power transistor, a resistor, or the like, is formed on the circuit board 2 in order to form a high-frequency circuit. When the electronic part 3 is one generating heat, such as an IC or an electronic part handling a large amount of electrical power, part of a cover 5 of the shield case 1 is cut and bent to form a contact piece 6 which contacts the electronic part 3 (IC), allowing the heat from the electronic part 3 to be dissipated, by conduction through the entire shield case 1, through the contact piece 6.

The contact piece 6 is formed by cutting part of the cover 5 into a C shape, and bending the cut portion inwardly of the shield case 1 such that it contacts the electronic part 3, with an end 7 of the bent portion positioned parallel to and thus being in uniform contact with the upper surface of the body of the electronic part 3. Silicone grease 8, which is an adhesive-like substance with good heat conductivity, is applied between the end 7 and the upper surface of the body of the electronic part 3 to increase heat dissipation efficiency.

In the above-described conventional heat-dissipating structure, however, the contact piece 6 is bent inwardly of the shield case 1 in order to bring it into contact with the electronic part 3, so that a hole 9 as large as the contact piece 6 is formed in the cover 5. Therefore, when the electronic device is one forming a high-frequency circuit, a high-frequency signal in the shield case 1 travels out through the hole 9, resulting in unnecessary emission and leakage of signals to the outside; or a high-frequency signal from an external electronic device rushes into the shield case 1 from the hole 9, and interferes with the operation of the electronic device.

There are some currently-used high-frequency electronic devices which incorporate a microcomputer. In these electronic devices, it is not possible to keep clocks in a normally-operating state. A possible solution to this problem is to form a smaller hole 9 in the cover 5. In order to make the hole 9 smaller, however, the width of the contact piece must be made narrower, which reduces the efficiency with which heat can be conducted, so that there is a limit to how small the contact piece 6 can be made. Accordingly, the hole 9, formed in correspondence with the size of the contact piece 6 that prevents a reduction in heat conduction, is covered with a conductive tape in the final step of producing the electronic device. This, however, increases the number of production steps and component parts (due to the use of the conductive tape), making the electronic device more costly. Therefore, the a present invention aims at achieving a heat-dissipating structure having a high heat conductivity and capable of reducing the amount of interfering signals emitted from or rushing into the shield case.

SUMMARY OF THE INVENTION

To overcome the above-described problem, according to the present invention, there is provided a heat-dissipating structure of an electronic part generating heat which comprises a shield case encasing the electronic part and having a cylindrical projecting portion formed so as to project inwardly of the shield case and contact the heat-generating electronic part encased in the shield case.

The cylindrical projecting portion may have a thermally-conductive, adhesive-like substance filled therein.

The cylindrical projecting portion may have a bottom being in contact with the electronic part.

The bottom may have a hole.

The cylindrical projecting portion with the hole in the bottom thereof may have a thermally-conductive, adhesive-like substance filled therein.

The cylindrical projecting portion with the bottom may include a resilient tongue piece being in resilient contact with the electronic part.

The cylindrical projecting portion may include a plurality of the tongue pieces formed radially.

The cylindrical projecting portion with the tongue piece may have a thermally-conductive, adhesive-like substance filled therein.

DESCRIPTION OF THE PREFERRED EMBODIMENT

Figure 1:
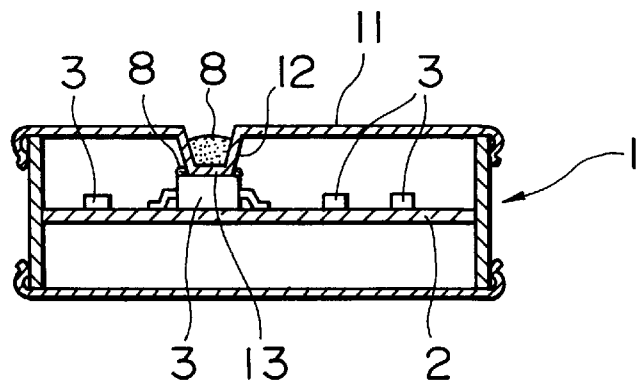
FIG. 1 is a sectional view of the main portion of a shield case, showing a heat-dissipating structure of an electronic part in accordance with the present invention.
Figure 2:
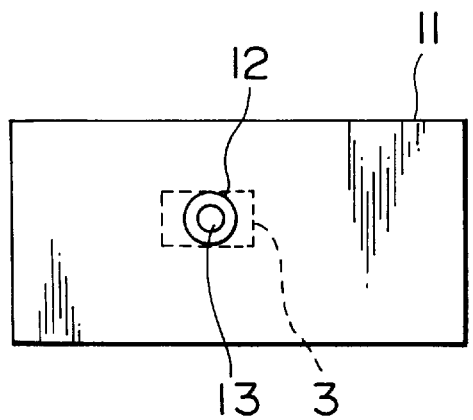
FIG. 2 is view of the cover in the heat-dissipating structure of an electronic part in accordance with the present invention.
Figure 3:
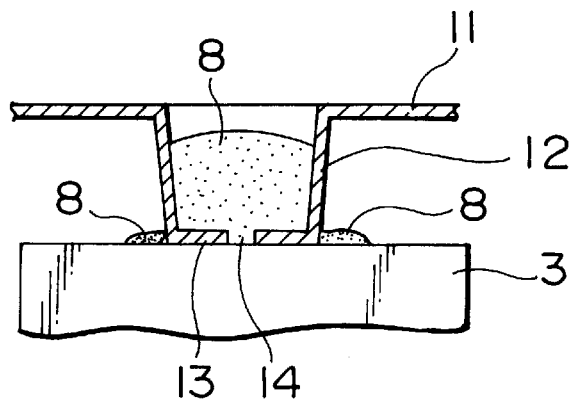
FIG. 3 is a sectional view of the main portion of a first modification of the heat-dissipating structure of an electronic part in accordance with the present invention.
Figure 4:
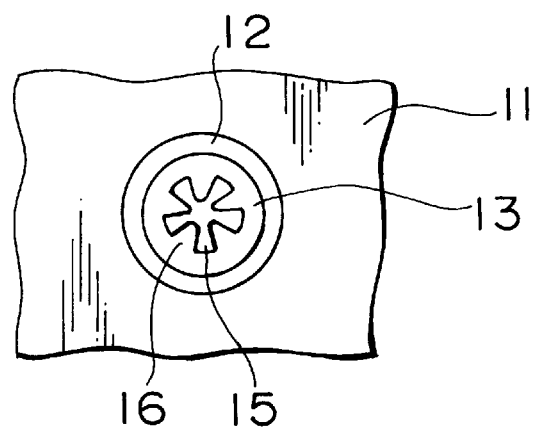
FIG. 4 is a plan view of a portion of the cover in a second modification of the heat-dissipating structure of an electronic part in accordance with the present invention.
Figure 5:
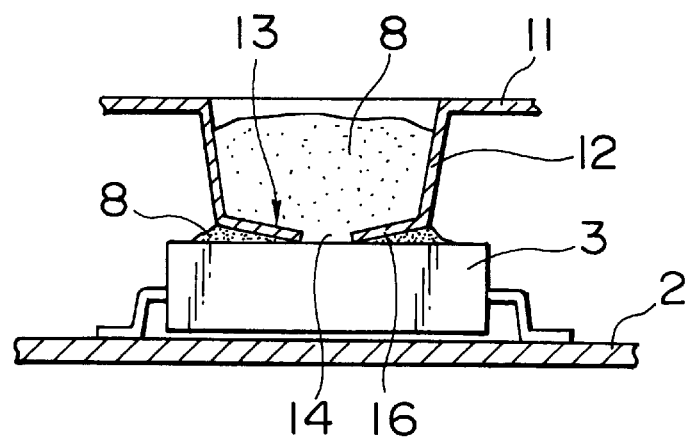
FIG. 5 is a sectional view of the main portion of the second modification of the heat-dissipating structure of an electronic part in accordance with the present invention.
Figure 6:
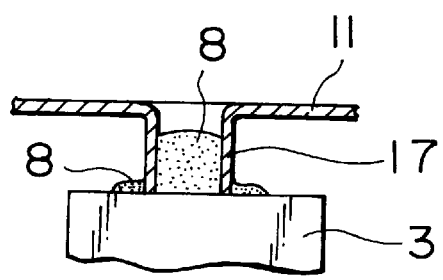
FIG. 6 is a sectional view of the main portion of a third modification of the heat-dissipating structure of an electronic part in accordance with the present invention.
Figure 7:
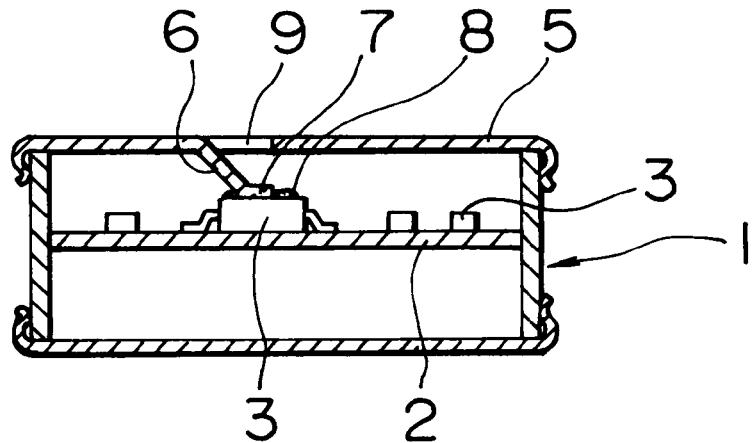
FIG. 7 is a sectional view of the main portion of a shield case, illustrating a conventional heat-dissipating structure of an electronic part.
Figure 8:
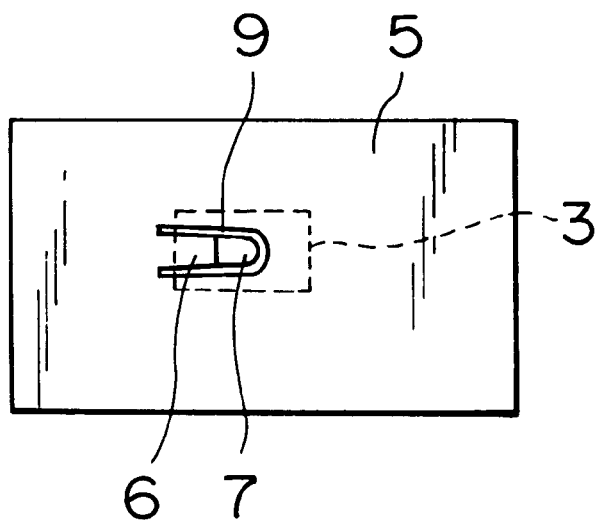
FIG. 8 is a plan view of the cover in the conventional heat-dissipating structure of an electronic part.

A description will now be given of an embodiment of a heat-dissipating structure of an electronic part and modifications thereof, with reference to FIGS. 1 to 6. FIG. 1 is a sectional view of the main portion of a shield case, illustrating a heat-dissipating structure in accordance with the present invention. FIG. 2 is a plan view of the cover in the heat-dissipating structure in accordance with the present invention. FIG. 3 is a sectional view of the main portion of a first modification of the heat-dissipating structure in accordance with the present invention. FIG. 4 is a plan view of a portion of the cover in a second modification of the heat-dissipating structure in accordance with the present invention. FIG. 5 is a sectional view of the main portion of FIG. 4. FIG. 6 is a sectional view of the main portion of a third modification of the heat-dissipating structure in accordance with the present invention. In these figures, corresponding parts to those of the conventional structure are given the same reference numerals, and will not be described below.

In FIGS. 1 and 2, a cylindrical projecting portion 12 is formed in a cover 11, by drawing, or the like, in correspondence with an electronic part 3 on a circuit board 2 encased in a shield case 1. The projecting portion 12 projects inwardly of the shield case 1, such that the bottom 13 thereof contacts the upper surface of the body of the electronic part 3. Silicone grease 8 is applied between the bottom 13 and the upper surface of the body of the electronic part 3. The silicone grease 8 is also filled into the inwardly projecting portion 12.

This construction allows heat generated by the electronic part 3 to be conducted through the entire shield case 1 via the projecting portion 12, without opening a hole in the cover 11. In this case, the projecting portion 12, which conducts heat through the entire shield case 1, is formed such that its bottom 13 contacts the upper surface of the body of the electronic part 3. In addition, the cylindrical shape of the projecting portion 12 provides a large sectional area for heat conduction, thereby increasing the efficiency with which heat is conducted. Heat is also conducted through the silicone grease 8 in the inwardly-projecting portion 12, so that the same effects can be obtained when silicone grease 8 is filled into the projecting portion as when the sectional area is increased by an equivalent amount in order to conduct heat, making it possible to further increase heat conduction efficiency.

As shown in a first modification of the heating-dissipating structure of the invention of FIG. 3, forming a hole 14 in the bottom 13 allows visual checking of the state of contact between the bottom 13 and the electronic part 3 from the outside. In addition, since the silicone grease 8, filled into the inwardly projection portion 12, can flow into the slight gap between the upper surface of the body of the electronic part 3 and the bottom 13 from the hole 14, it is no longer necessary to previously apply the silicone grease 8 to the upper surface of the body of the electronic part 3. Further, since the hole 14 can be made small, the shielding effect of the cover is not reduced.

As shown in a second modification of the heat-dissipating structure of the present invention of FIGS. 4 and 5, a plurality of radial slits 15 are formed successively with respect to the hole 14, thereby forming a plurality of tongue pieces 16. As shown in FIG. 5, resiliently contacting the tongue pieces 16 with the upper surface of the electronic part 3 prevents them from pressing against the electronic part 3 with too much force and breaking it. In addition, since the tongue pieces 16 resiliently contact the electronic part, they slope with respect to the upper surface of the body of the electronic part 3, allowing a sufficient amount of silicone grease 8 to collect between the tongue pieces 16 and the upper surface of the body of the electronic part 3, thereby further increasing the heat-dissipating effect. Also in this case, the silicone grease 8 does not need to be previously applied to the upper surface of the body of the electronic part 3. The silicone grease 8 may be filled into the inwardly-projecting portion after assembly of the electronic part. It is to be noted that although the projecting portion 12 illustrated in FIGS. 1 to 5 was cylindrically shaped, it may be formed into the shape of a prism. It is also to be noted that although the tongue pieces 16 were formed radially, they may be formed, for example, in the direction of the circumference of the bottom 13.

In a third modification of the heat-dissipating structure of FIG. 6, the projecting portion 17, formed into either the shape of a cylinder or prism, is different from the aforementioned projecting portions 12 in that it does not have the bottom 13. A lower end of the projecting portion 17 contacts the upper surface of the body of the electronic part 3. Silicone grease 8 may be filled into the inwardly-projecting portion 17. Also in this case, the silicone grease 8 acts to conduct heat in the projecting portion 17, so that the same effects can be obtained when silicone grease 8 is filled as when the sectional area of the projecting portion 17 is made large.

As can be understood from the foregoing description, according to the heat-dissipating structure of an electronic part in accordance with the present invention, a cylindrical projecting portion is formed in a shield case so as to project inwardly of the shield case and contact the electronic part encased in the shield case. Accordingly, the cylindrically-shaped projecting portion, which contacts the electronic part, provides a larger cross sectional area for heat conduction, thereby increasing the efficiency with which heat is conducted.

In addition, according to the heat-dissipating structure of an electronic part in accordance with the present invention, a thermally-conductive, adhesive-like substance is filled into the cylindrical inwardly projecting portion, so that heat is also conducted by this adhesive-like substance. Thus, the same effects can be obtained when an adhesive-like substance is filled as when the sectional area of the projecting portion is increased by an equivalent amount, making it possible to further increase the efficiency of heat conduction.

Further, according to the heat-dissipating structure of an electronic component in accordance with the present invention, the cylindrical projecting portion has a bottom contacting the electronic part, so that the area of contact between the projecting portion and the electronic part is increased, thereby further increasing heat conduction.

Still further, according to the heat-dissipating structure of an electronic part in accordance with the present invention, a hole is formed in the bottom of the projecting portion, allowing visual checking of the state of contact between the bottom and the electronic part from the outside. In addition, since a thermally-conductive, adhesive-like substance (such as silicone grease), filled into the inwardly-projecting portion, can flow into the slight gap between the upper surface of the body of the electronic part and the bottom from the hole, it is no longer necessary to previously apply an adhesive-like substance to the upper surface of the body of the electronic part, making it easier to apply the adhesive-like substance. Further, the hole can be made small, which increases the shielding effect.

Still further, according to the heating-dissipating structure of an electronic part in accordance with the present invention, resilient tongue pieces are formed at the bottom of the projecting portion so as to resiliently contact the electronic part. This prevents them from pressing against the electronic part with too much force and thus from breaking the electronic part. In addition, since the tongue pieces resiliently contact the electronic part, they slope with respect to the upper surface of the body of the electronic part, making it possible for a sufficient amount of a thermally conductive, adhesive-like substance (such as silicone grease) to collect between the tongue pieces and the upper surface of the body of the electronic part, as a result of which heat is dissipated more effectively.

Still further, according to the heat-dissipating structure of an electronic part in accordance with the present invention, a plurality of tongue pieces are radially provided, making it easier for a thermally-conductive, adhesive-like substance (such as silicone grease) to flow from slits formed between the tongue pieces. This causes the electronic part and the bottom of the projecting portion to be joined together with a sufficient amount of adhesive-like substance, so that heat is dissipated even more effectively. In addition, it is not necessary to previously apply any adhesive-like substance to the upper surface of the body of the electronic part, so that it is only necessary to fill the adhesive-like substance into the inwardly-projecting portion after assembling the electronic part, making it easier to apply the adhesive-like substance.

What is claimed is:

1. A heat-dissipating structure of a heat generating electronic part, comprising:

a shield case encasing said electronic part, said shield case having a cylindrical projecting portion formed so as to project inwardly of said shield case, wherein said cylindrical projecting portion comprises a bottom having a hole, said bottom being in contact with said electronic part, wherein said cylindrical projecting portion further comprises a thermally-conductive, adhesive-like substance filled therein, said thermally-conductive, adhesive-like substance projecting through said hole and contacting said electronic part.

2. A heat-dissipating structure of a heat generating electronic part, comprising:

a shield case encasing said electronic part, said shield case having a cylindrical projecting portion formed so as to project inwardly of said shield case, wherein said cylindrical projecting portion comprises a bottom in contact with said electronic part, said bottom comprising a plurality of radially spaced resilient tongue pieces, said tongue pieces resiliently contacting said electronic part, wherein said cylindrical projecting portion further comprises a thermally-conductive, adhesive-like substance filled therein, said thermally-conductive, adhesive-like substance projecting through said bottom and contacting said electronic part.

* * * * *